(12) United States Patent
Claridge et al.

(10) Patent No.: US 11,193,042 B2
(45) Date of Patent: Dec. 7, 2021

(54) PROCESS FOR MANUFACTURING A SUB-NANOMETER-THICK COATING ON AN AMORPHOUS MATERIAL, EXHIBITING NANOMETER-SCALE CHEMICAL PATTERNS

(71) Applicant: Purdue Research Foundation, West Lafayette, IN (US)

(72) Inventors: Shelley A. Claridge, Lafayette, IN (US); Tyson C. Davis, Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 64 days.

(21) Appl. No.: 16/820,786

(22) Filed: Mar. 17, 2020

(65) Prior Publication Data

US 2020/0299542 A1  Sep. 24, 2020

Related U.S. Application Data

(60) Provisional application No. 62/819,908, filed on Mar. 18, 2019.

(51) Int. Cl.
*C09D 191/00* (2006.01)
*B05D 1/28* (2006.01)

(52) U.S. Cl.
CPC .......... *C09D 191/00* (2013.01); *B05D 1/286* (2013.01)

(58) Field of Classification Search
CPC ...... B05D 1/204; B05D 1/286; C09D 191/00; G03F 7/0002

USPC .............................................. 156/247, 275.5
See application file for complete search history.

(56) References Cited

FOREIGN PATENT DOCUMENTS

WO   WO-2014124383 A1 *  8/2014  ........... B65B 65/006

OTHER PUBLICATIONS

EIC search report, dated Aug. 18, 2021 (Year: 2021).*
Schreiber, F., "Structure and Growth of Self-Assembling Monolayers", Prog. Surf. Sci. 2000, 65, pp. 151-256.
Mann, J., et al, "Noncovalent Functionalization of Graphene by Molecular and Polymeric Adsorbates", J. Phys. Chem. Lett. 2013, 4, pp. 2649-2657.
MacLeod, J., et al, "Molecular Self-Assembly on Graphene", Small 2014, 10, pp. 1038-1049.

(Continued)

*Primary Examiner* — Sonya M Sengupta
(74) *Attorney, Agent, or Firm* — Liang Zeng Yan; Purdue Research Foundation (57) ABSTRACT

The present invention generally relates to a method for creating a chemically structured surface with structural elements as small as 1 nm, on a material that does not itself display a high degree of ordering, using thin molecular layers that minimize the material added through the coating. In particular, the present invention discloses a method for assembling a chemical pattern on a surface, comprising pattern elements with scales that can be as small as 1 nm, and then transferring that pattern to another substrate, on which the pattern would not form natively. In the described method, the patterned monolayer is comprised of polymerizable amphiphiles such as diyne phospholipids or diynoic acids, which are transferred from the ordering substrate using a transferring material such as poly(dimethylsiloxane).

20 Claims, 7 Drawing Sheets

(56) References Cited

OTHER PUBLICATIONS

Claridge, S., "Standing, Lying, and Sitting: Translating Building Principles of the Cell Membrane to Synthetic 2D Material Interfaces", Chem. Comm. 2018, 54, pp. 6681-6691.

Hoeppener, S., et al., "Formation of Au-55 Strands on a Molecular Template at the Solid-Liquid Interface", Nano Lett. 2002, 2, pp. 459-463.

Iritani, K, et al, "Host-Guest Chemistry in Integrated Porous Space Formed by Molecular Self-Assembly at Liquid-Solid Interfaces", Langmuir 2017, 33, pp. 4601-4618.

Tahara, K., et al, "Functionalized Surface-Confined Pores: Guest Binding Directed by Lateral Noncovalent Interactions at the Solid-Liquid Interface", ACS Nano 2014, 8, pp. 8683-8694.

Bang, J., et al, "Sitting Phases of Polymerizable Amphiphiles for Controlled Functionalization of Layered Materials", J. Am. Chem. Soc. 2016, 138, pp. 4448-4457.

Choong, S., et al, "Sitting Phase Monolayers of Polymerizable Phospholipids Create Dimensional, Molecular-Scale Wetting Control for Scalable Solution Based Patterning of Layered Materials", ACS Appl. Mater. Interf. 2017, 9, pp. 19326-19334.

Hayes, T., et al, "Multimicrometer Noncovalent Monolayer Domains on Layered Materials through Thermally Controlled Langmuir-Schaefer Conversion for Noncovalent 2D Functionalization", ACS Appl. Mater. Interf. 2017, 9, pp. 36409-36416.

Miura, A., et al, "Light- and STM-Tip-Induced Formation of One-Dimensional and Two-Dimensional Organic Nanostructures", Langmuir 2003, 19, pp. 6474-6482.

Giridharagopal, R., et al, "Substrate-Dependent Properties of Polydiacetylene Nanowires on Graphite and MoS2", ACS Nano 2008, 2, pp. 1571-1580.

Okawa, Y., et al, "Linear Chain Polymerization Initiated by a Scanning Tunneling Microscope Tip at Designated Positions", J. Chem. Phys. 2001, 115, pp. 2317-2322.

\* cited by examiner

PROCESS FOR MANUFACTURING A SUB-NANOMETER-THICK COATING ON AN AMORPHOUS MATERIAL, EXHIBITING NANOMETER-SCALE CHEMICAL PATTERNS

CROSS REFERENCE TO RELATED APPLICATIONS

This present patent application relates to and claims the priority benefit of U.S. Provisional Application Ser. No. 62/819,908, filed Mar. 18, 2019, the content of which is hereby incorporated by reference in its entirety into this instant disclosure.

GOVERNMENT SUPPORT CLAUSE

This invention was made with government support under grant N66001-17-1-4046 awarded by the Defense Advanced Research Projects Agency (DARPA). The government has certain rights in the invention.

TECHNICAL FIELD

The present invention generally relates to a method for creating a chemically structured surface with structural elements as small as 1 nm, on a material that does not itself display a high degree of ordering, using very thin molecular layers that minimize the material added through the coating. In particular, the present invention discloses a method for assembling a chemical pattern on a surface, comprising pattern elements with scales that can be as small as 1 nm, and then transferring that pattern to another substrate, on which the pattern would not form natively.

BACKGROUND

This section introduces aspects that may help facilitate a better understanding of the disclosure. Accordingly, these statements are to be read in this light and are not to be understood as admissions about what is or is not prior art.

Surface layers of atoms in a material function as a skin that mediates interactions with the environment, conferring spatially encoded functions including adhesion, electrical conductivity, and interactions with light. For many applications, it would be useful to design surface layers of atoms to maximize desired functional and structural precision, while minimizing the thickness of the coating, which also represents a barrier between the substrate material and the environment. The ability to control surface chemistry of soft materials to create high-resolution functional patterns would represent a significant advance. Surface chemistry can be used to control local binding to other materials, molecular recognition processes, and wetting.

BRIEF SUMMARY OF INVENTIONS

This invention generally relates to a method for manufacturing a coating or functional surface with structural elements as small as 1 nm, on a material that itself may not display a high degree of ordering, using very thin molecular layers (typically <1 nm) that minimize the material added through the coating. Functionalization of the substrate employs functional molecules that are assembled on a substrate that creates the desired ordering, and transferred to the receiving substrate.

In some illustrative embodiments, this invention relates to a method for manufacturing a coating or functional surface comprising the steps of
  a. preparing a polymerizable amphiphile comprising both hydrophobic and hydrophilic constituents with chemical functional groups;
  b. preparing a supporting 2D material substrate;
  c. preparing a monolayer or thin film of said polymerizable amphiphile on said supporting 2D material substrate, wherein said hydrophobic and hydrophilic constitutes of the polymerizable amphiphile are positioned to form a chemical functional pattern, such as parallel lines of about 1-nm-wide with said chemical functional groups arranged with a controlled periodicity in the range of about 5-10 nm;
  d. polymerizing said amphiphiles to afford a polymerized monolayer or thin film on said supporting 2D material substrate;
  e. applying a transferring material over the polymerized monolayer or thin film on said supporting 2D material substrate; and
  f. curing or crosslinking said transferring material and transferring the polymerized monolayer or thin film from said supporting 2D material substrate to a product.

In some illustrative embodiments, this invention relates to a process for manufacturing a sub-nanometer-thick coating or functional surface according to the steps disclosed herein, the process further comprising a step of chemical processing/manipulation of said polymerized monolayer or thin film to create a multifunctional patterned surface.

In some illustrative embodiments, this invention relates to a process for manufacturing a sub-nanometer-thick coating or functional surface according to the steps disclosed herein, wherein said processing involves addition of inorganic or organic structures templated by the chemical functional pattern.

In some illustrative embodiments, this invention relates to a process for manufacturing a sub-nanometer-thick coating or functional surface according to the steps disclosed herein, wherein said process further comprising a step of chemical processing/manipulation of said polymerized monolayer or thin film before applying said transferring material.

In some illustrative embodiments, this invention relates to a process for manufacturing a sub-nanometer-thick coating or functional surface according to the steps disclosed herein, wherein multiple types of polymerized amphiphiles are utilized in preparing the monolayer or thin film, resulting in creation of a multifunctional patterned surface.

In some illustrative embodiments, this invention relates to a process for manufacturing a sub-nanometer-thick coating or functional surface according to the steps disclosed herein, wherein said transferring material is a polymer.

In some illustrative embodiments, this invention relates to a process for manufacturing a sub-nanometer-thick coating or functional surface according to the steps disclosed herein, wherein said transferring material is polydimethyl siloxane (PDMS), polyacrylamide (PAM) or similar materials.

In some illustrative embodiments, this invention relates to a process for manufacturing a sub-nanometer-thick coating or functional surface according to the steps disclosed herein, wherein said supporting 2D material substrate is graphene, highly oriented pyrolytic graphite (HOPG), or a layered material such as $MoS_2$ or $WS_2$.

In some illustrative embodiments, this invention relates to a process for manufacturing a sub-nanometer-thick coating or functional surface according to the steps disclosed herein, wherein said polymerization of an amphiphile monolayer or thin film is performed by irradiating with an UV light.

In some illustrative embodiments, this invention relates to a process for manufacturing a sub-nanometer-thick coating or functional surface according to the steps disclosed herein, wherein said polymerizable amphiphile is a polymerizable lipid.

In some illustrative embodiments, this invention relates to a process for manufacturing a sub-nanometer-thick coating or functional surface according to the steps disclosed herein, wherein said polymerizable amphiphile is a single-chain or dual chain polymerizable lipid incorporating one or more functional groups such as carboxylic acids, amines, or phosphates.

In some illustrative embodiments, this invention relates to a process for manufacturing a sub-nanometer-thick coating or functional surface according to the steps disclosed herein, wherein said polymerizable single-chain amphiphile is 10,12-pentacosadiynoic acid (PCDA), 10,12-tricosadiynoic acid (TCDA), 10,12-pentacosadiynamine, or other like polymerizable single-chain amphiphile.

In some illustrative embodiments, this invention relates to a process for manufacturing a sub-nanometer-thick coating or functional surface according to the steps disclosed herein, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

In some illustrative embodiments, this invention relates to a process for manufacturing a sub-nanometer-thick coating or functional surface according to the steps disclosed herein, wherein one or more of the molecules used for functionalization is either a simple functional alkyl chain bearing the functional group required for transfer, or comprises an alkyl chain, functional group for transfer, and a nonpolar functional group.

In some illustrative embodiments, this invention relates to a process for manufacturing a sub-nanometer-thick coating or functional surface according to the steps disclosed herein wherein ordering of the molecular film prior to transfer is achieved without an alkyl chain (for instance, through the use of large polycyclic aromatic groups).

In some illustrative embodiments, this invention relates to a process for manufacturing a sub-nanometer-thick coating or functional surface according to the steps disclosed herein, wherein the pre-assembled molecular film is transferred directly via a reactive group embedded in the ordered monomers, without the need for pre-polymerization.

In some illustrative embodiments, this invention relates to a sub-nanometer-thick coating or functional surface prepared according to the processes disclosed herein.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 20%, within 10%, within 5%, or within 1% of a stated value or of a stated limit of a range.

In the present disclosure the term "substantial" or "substantially" can allow for a degree of variability in a value or range, for example, within 80%, within 90%, within 95%, or within 99% of a stated value or of a stated limit of a range.

In this document, the terms "a," "an," or "the" are used to include one or more than one unless the context clearly dictates otherwise. The term "or" is used to refer to a nonexclusive "or" unless otherwise indicated. In addition, it is to be understood that the phraseology or terminology employed herein, and not otherwise defined, is for the purpose of description only and not of limitation. Any use of section headings is intended to aid reading of the document and is not to be interpreted as limiting. Further, information that is relevant to a section heading may occur within or outside of that particular section. Furthermore, all publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

As used herein, an "amphiphile" is defined as a chemical compound comprising both hydrophilic and hydrophobic constituents.

As used herein, a "thin film" is defined as a layer of material ranging from less than 1 nm to several thousand nanometers in thickness.

A layered, or two-dimensional (2D) material generally has a layer thickness between one atomic layer and a few nm. Even though the existence of two-dimensional materials have been theorized since the 1940's (Wallace, P. R. *Phys. Rev.* 1947, 71, 622-634), it was not until 2004 that it was shown that these materials can be stable as freestanding sheets, by the isolation of individual graphene sheets (Novoselov, K. S. et al., *Science* 2004, 306, 666-669). Layers may be stacked to form macroscopic materials; for instance, highly oriented pyrolytic graphite (HOPG) consists of stacks of graphene layers.

In some illustrative embodiments, this invention relates to a process for manufacturing a sub-nanometer-thick coating or functional surface comprising the steps of
  a. preparing a polymerizable amphiphile comprising both hydrophobic and hydrophilic constituents with chemical functional groups;
  b. preparing a supporting 2D material substrate;
  c. preparing a monolayer or thin film of said polymerizable amphiphile on said supporting 2D material substrate, wherein said hydrophobic and hydrophilic constitutes of the polymerizable amphiphile are positioned to form a chemical functional pattern, such as parallel lines of about 1-nm-wide with said chemical functional groups arranged with a controlled periodicity in the range of about 5-10 nm;
  d. polymerizing said amphiphiles to afford a polymerized monolayer or thin film on said supporting 2D material substrate;
  e. applying a transferring material over the polymerized monolayer or thin film on said supporting 2D material substrate; and
  f. curing or crosslinking said transferring material and transferring the polymerized monolayer or thin film from said supporting 2D material substrate to a product.

In some illustrative embodiments, this invention relates to a process for manufacturing a sub-nanometer-thick coating or functional surface according to the steps disclosed herein, the process further comprising a step of chemical processing/manipulation of said polymerized monolayer or thin film to create a multifunctional patterned surface.

In some illustrative embodiments, this invention relates to a process for manufacturing a sub-nanometer-thick coating or functional surface according to the steps disclosed herein, wherein said processing involves addition of inorganic or organic structures templated by the chemical functional pattern.

In some illustrative embodiments, this invention relates to a process for manufacturing a sub-nanometer-thick coating or functional surface according to the steps disclosed herein, wherein said process further comprising a step of chemical processing/manipulation of said polymerized monolayer or thin film before applying said transferring material.

In some illustrative embodiments, this invention relates to a process for manufacturing a sub-nanometer-thick coating or functional surface according to the steps disclosed herein, wherein multiple types of polymerized amphiphiles are utilized in preparing the monolayer or thin film, resulting in creation of a multifunctional patterned surface.

In some illustrative embodiments, this invention relates to a process for manufacturing a sub-nanometer-thick coating or functional surface according to the steps disclosed herein, wherein said transferring material is a polymer.

In some illustrative embodiments, this invention relates to a process for manufacturing a sub-nanometer-thick coating or functional surface according to the steps disclosed herein, wherein said transferring material is polydimethyl siloxane (PDMS), polyacrylamide (PAM), or similar materials.

In some illustrative embodiments, this invention relates to a process for manufacturing a sub-nanometer-thick coating or functional surface according to the steps disclosed herein, wherein said supporting 2D material substrate is graphene, highly oriented pyrolytic graphite (HOPG), or a layered material such as $MoS_2$ or $WS_2$.

In some illustrative embodiments, this invention relates to a process for manufacturing a sub-nanometer-thick coating or functional surface according to the steps disclosed herein, wherein said polymerization of an amphiphile monolayer or thin film is performed by irradiating with an UV light.

In some illustrative embodiments, this invention relates to a process for manufacturing a sub-nanometer-thick coating or functional surface according to the steps disclosed herein, wherein said polymerizable amphiphile is a polymerizable lipid.

In some illustrative embodiments, this invention relates to a process for manufacturing a sub-nanometer-thick coating or functional surface according to the steps disclosed herein, wherein said polymerizable amphiphile is a single-chain or dual chain polymerizable lipid incorporating one or more functional groups such as carboxylic acids, amines, or phosphates.

In some illustrative embodiments, this invention relates to a process for manufacturing a sub-nanometer-thick coating or functional surface according to the steps disclosed herein, wherein said polymerizable single-chain amphiphile is 10,12-pentacosadiynoic acid (PCDA), 10,12-tricosadiynoic acid (TCDA), or 10,12-pentacosa-diynamine, or other like polymerizable single-chain amphiphile.

In some illustrative embodiments, this invention relates to a process for manufacturing a sub-nanometer-thick coating or functional surface according to the steps disclosed herein, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

In some illustrative embodiments, this invention relates to a process for manufacturing a sub-nanometer-thick coating or functional surface according to the steps disclosed herein, wherein one or more of the molecules used for functionalization is either a simple functional alkyl chain bearing the functional group required for transfer, or comprises an alkyl chain, functional group for transfer, and a nonpolar functional group.

In some illustrative embodiments, this invention relates to a process for manufacturing a sub-nanometer-thick coating or functional surface according to the steps disclosed herein wherein ordering of the molecular film prior to transfer is achieved without an alkyl chain (for instance, through the use of large polycyclic aromatic groups).

In some illustrative embodiments, this invention relates to a process for manufacturing a sub-nanometer-thick coating or functional surface according to the steps disclosed herein, wherein the pre-assembled molecular film is transferred directly via a reactive group embedded in the ordered monomers, without the need for pre-polymerization.

In some illustrative embodiments, this invention relates to a sub-nanometer-thick coating or functional surface prepared according to the processes disclosed herein.

In some other illustrative embodiments, this invention relates to a sub-nanometer-thick coating or functional surface prepared according to the process of
  a. preparing a polymerizable amphiphile comprising both hydrophobic and hydrophilic constituents with chemical functional groups;

b. preparing a supporting 2D material substrate;
c. preparing a monolayer or thin film of said polymerizable amphiphile on said supporting 2D material substrate, wherein said hydrophobic and hydrophilic constitutes of the polymerizable amphiphile are positioned to form a chemical functional pattern, such as parallel lines of about 1-nm-wide with said chemical functional groups arranged with a controlled periodicity in the range of about 5-10 nm;
d. polymerizing said amphiphiles to afford a polymerized monolayer or thin film on said supporting 2D material substrate;
e. applying a transferring material over the polymerized monolayer or thin film on said supporting 2D material substrate; and
f. curing or crosslinking said transferring material and transferring the polymerized monolayer or thin film from said supporting 2D material substrate to a product.

In some illustrative embodiments, this invention relates to a sub-nanometer-thick coating or functional surface prepared according to the process disclosed herein, wherein said process further comprising a step of chemical processing/manipulation of said polymerized monolayer or thin film to create a multifunctional patterned surface.

In some illustrative embodiments, this invention relates to a sub-nanometer-thick coating or functional surface prepared according to the process disclosed herein, wherein said process further comprising a step of chemical processing/manipulation of said polymerized monolayer or thin film before applying said transferring material.

In some illustrative embodiments, this invention relates to a sub-nanometer-thick coating or functional surface prepared according to the process disclosed herein, wherein said transferring material is a polymer.

In some illustrative embodiments, this invention relates to a sub-nanometer-thick coating or functional surface prepared according to the process disclosed herein, wherein said transferring material is polydimethyl siloxane (PDMS), polyacrylamide (PAM), or similar materials.

In some illustrative embodiments, this invention relates to a sub-nanometer-thick coating or functional surface prepared according to the process disclosed herein, wherein said polymerization of an amphiphile monolayer or thin film is performed by irradiating with an UV light.

In some illustrative embodiments, this invention relates to a sub-nanometer-thick coating or functional surface prepared according to the process disclosed herein, wherein said supporting 2D material substrate is graphene, highly oriented pyrolytic graphite (HOPG), or a layered material such as $MoS_2$ or $WS_2$.

In some illustrative embodiments, this invention relates to a sub-nanometer-thick coating or functional surface prepared according to the process disclosed herein, wherein said polymerizable amphiphile is a polymerizable lipid.

In some illustrative embodiments, this invention relates to a sub-nanometer-thick coating or functional surface prepared according to the process disclosed herein, wherein said polymerizable amphiphile is a single-chain fatty amine or dual-chain phospholipid with a terminal amine.

In some illustrative embodiments, this invention relates to a sub-nanometer-thick coating or functional surface prepared according to the process disclosed herein, wherein said polymerizable single-chain amphiphile is 10,12-pentacosadiynoic acid (PCDA), 10,12-tricosadiynoic acid (TCDA), or 10,12-pentacosa-diynamine.

In some illustrative embodiments, this invention relates to a sub-nanometer-thick coating or functional surface prepared according to the process disclosed herein, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

In some illustrative embodiments, this invention relates to a sub-nanometer-thick coating or functional surface prepared according to the process disclosed herein, wherein one or more of the molecules used for functionalization is either a simple functional alkyl chain bearing the functional group required for transfer, or comprises an alkyl chain, functional group for transfer, and a nonpolar functional group.

In some illustrative embodiments, this invention relates to a sub-nanometer-thick coating or functional surface prepared according to the process disclosed herein wherein ordering of the molecular film prior to transfer is achieved without an alkyl chain (for instance, through the use of large polycyclic aromatic groups).

In some illustrative embodiments, this invention relates to the process disclosed herein, wherein the pre-assembled molecular film is transferred directly via a reactive group embedded in the ordered monomers, without the need for pre-polymerization.

Molecular monolayers are often used to control the surface chemistry of materials. For instance, functional alkanethiol monolayers on coinage metals (Au, Ag, etc) have been broadly used to change the surface chemistry of the metal surface to control its interactions with the environment (Love, J C, et al., *Chem. Rev.* 2005, 105, 1103-1169). Patterned transfer of alkanethiols to the metal surface using techniques including microcontact printing enables patterning of surface chemistry at µm and 100-nm scales. Silane chemistry can similarly be used to control local functional patterning of $SiO_2$ and soft materials including poly(dimethylsiloxane) (PDMS) (Xia, Y N, et al., *Annu. Rev. Mater. Sci.* 1998, 28, 153-184; Schreiber F., *Prog. Surf. Sci.* 2000, 65, 151-256).

Noncovalently functionalized 2D materials (e.g. graphite, graphene, $MoS_2$) are notable in regards to interfacial templating, because structural motifs in the monolayer structure enable creation of high-resolution functional patterns with scales well below 10 nm (Mann, J A et al., *J. Phys. Chem. Lett.* 2013, 4, 2649-2657; MacLeod J M, et al., *Small* 2014, 10, 1038-1049; Claridge, S A et al., *Chem. Comm.* 2018, 54, 6681-6691). Molecules in noncovalently adsorbed monolayers on 2D materials such as graphite typically rely in part on large van der Waals contact areas with the substrate (e.g. long alkyl chains, polycyclic aromatic hydrocarbons) to stabilize the monolayer. Due to the large area occupied by each molecule on the surface, such monolayers can present structured binding sites including 1-nm wide functional stripes (e.g. COOH, $NH_2$) with ~5-nm pitch, or 1-10 nm pores in which the substrate is exposed; such motifs allow for the adsorption of nanoscopic objects (e.g. C60, metallic nanocrystals) (Hoeppener S et al., *Nano Lett.* 2002, 2, 459-463; Iritani K, et al., *Langmuir* 2017, 33, 4601-4618).

Figure 1A:
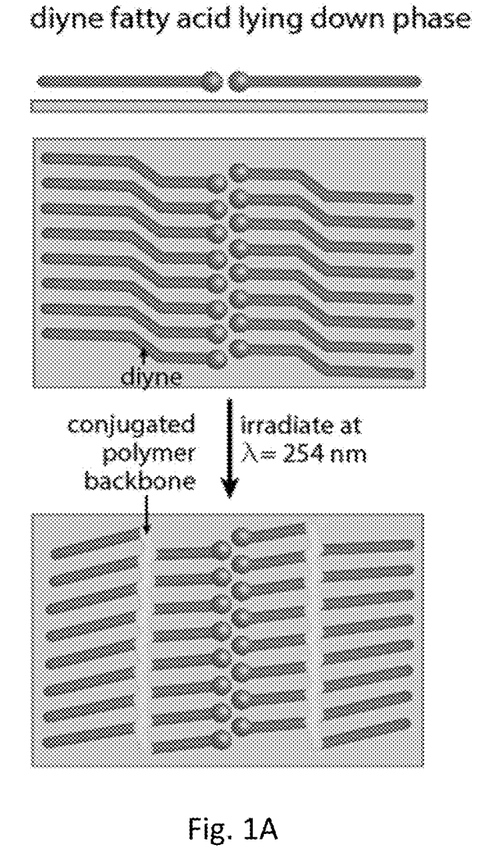
FIG. 1A illustrates a diyne fatty acid in a lying down phase.
Figure 1B:
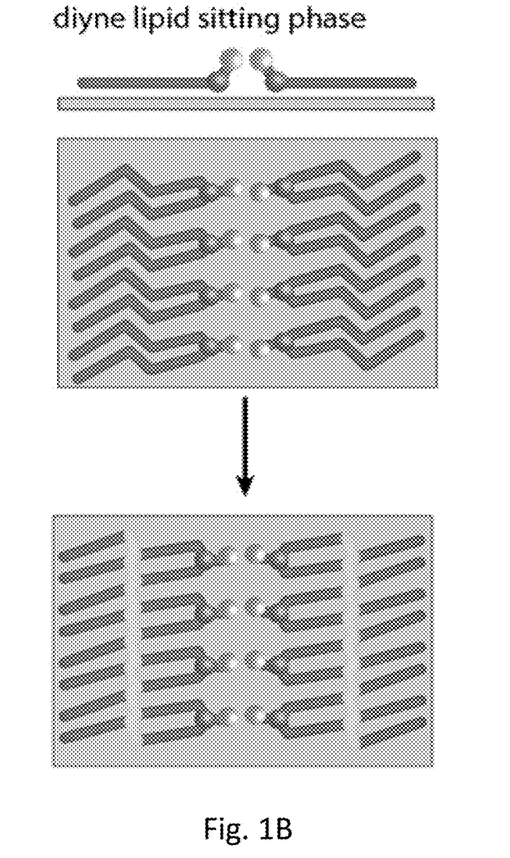
FIG. 1B illustrates a diyne phospholipid in a sitting phase.
Figure 1C:
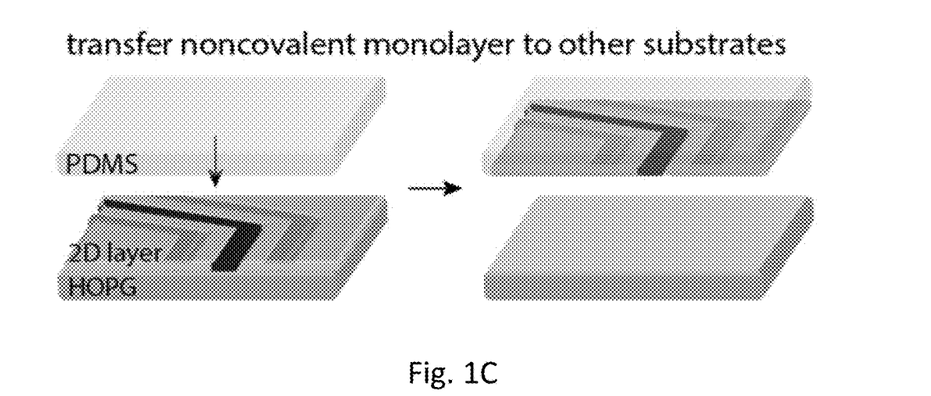
FIG. 1C illustrates PDMS transfer of a patterned monolayer on a 2D material to a soft, amorphous material.

The noncovalent molecule-substrate contact confers less stability than the more robust bonds (e.g. thiol-Au) that stabilize standing phase monolayers. However, assembly of molecules that incorporate a polymerizable moiety enables molecules within the monolayer to be tethered together, increasing stability. FIG. 1 illustrates noncovalent lamellar monolayers of diynoic acids and diyne phospholipids, which assemble on highly oriented pyrolytic graphite (HOPG) and other 2D materials. Photopolymerization of the diyne creates a conjugated ene-yne polymer backbone. The primary interest in this surface chemistry has been in utilization of the ene-yne as molecular wire; however, its presence can also be used to increase monolayer robustness.

Here, we demonstrate that high-resolution functional patterns present in monolayer of this type can be transferred to the surface of a soft, nonepitaxial material. This is achieved by casting PDMS on a pre-assembled polymerized monolayer, and curing the elastomer. After curing, the monolayer remains bound to the surface of the PDMS, creating local patterns in its surface chemistry that modulate its local wetting and interactions with light.

Preparation and Transfer of Striped Monolayers on HOPG.

Striped monolayers of 10,12-pentacosadiynoic acid (PCDA) and 1,2-bis(10,12-tricosadiynoyl)-sn-glycero-3-phosphoethanolamine (diyne PE) were prepared via Langmuir-Schaefer (LS) conversion based on procedures reported previously by our group (Bang, J J, et al., *J. Am. Chem. Soc.* 2016, 138, 4448-4457; Hayes, T R, et al., *ACS Appl. Mater. Interf.* 2017, 9, 36409-35416) and others (Miura, A, et al., *Langmuir* 2003, 19, 6474-6482; Giridharagopal, R et al, *ACS Nano* 2008, 2, 1571-1580; Okawa, Y et al, *J. Chem. Phys.* 2001, 115, 2317-2322). Monolayers were polymerized via UV irradiation; poly dimethylsiloxane (PDMS) was then cast on the monolayers.

Figure 2A:
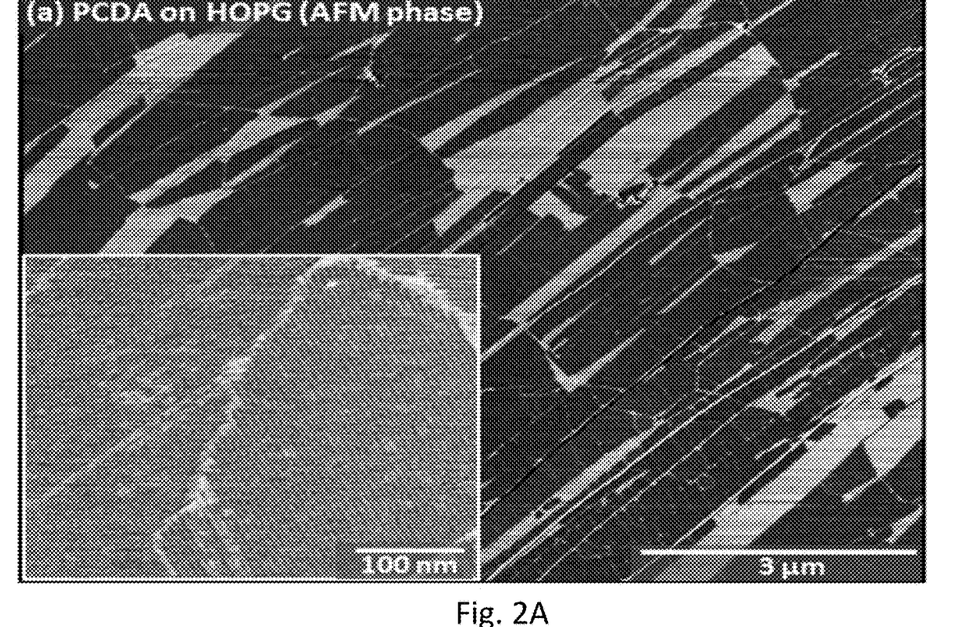
FIG. 2A shows atomic force microscopy (AFM) phase images showing domain structure and lamellar structure (inset) for PCDA on HOPG.
Figure 2B:
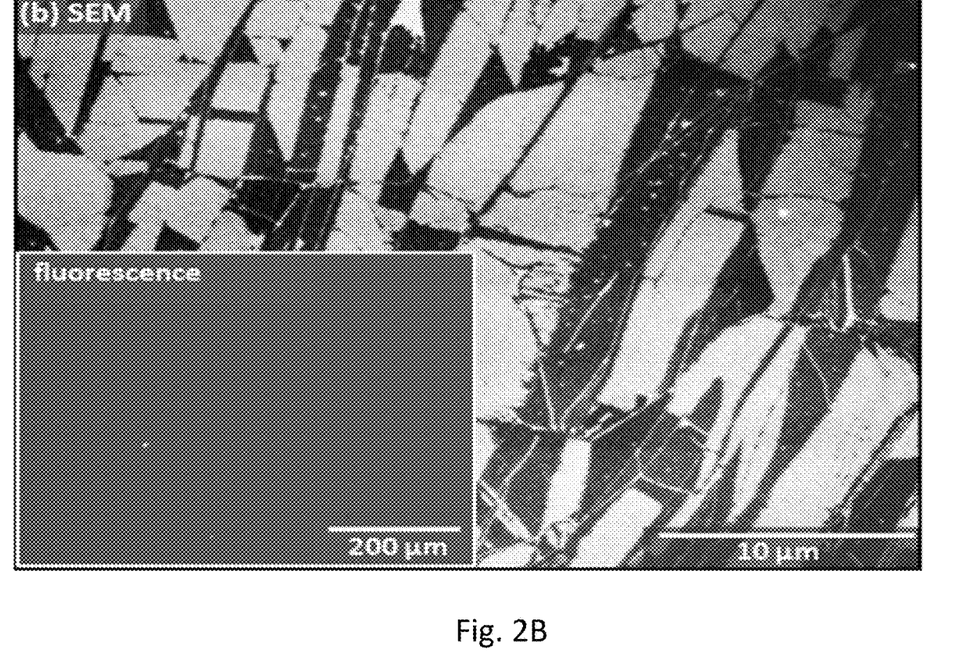
FIG. 2B shows scanning electron microscopy (SEM) and fluorescence (inset) microscopy images illustrating domain structures of PCDA on HOPG.

Monolayers were characterized by AFM and SEM prior to PDMS transfer to examine nanoscopic lamellar structure and microscale domain structure; images of polymerized PCDA monolayers are shown in FIG. 2a and FIG. 2b. AFM images illustrate striped lamellar patterns in epitaxy with the HOPG lattice, while larger SEM images show domain ordering over μm scales, with domains frequently terminating at step edges in the HOPG (long lines running approximately top to bottom in FIG. 2a). The conjugated ene-yne formed through photopolymerization (FIG. 1a) can fluoresce (ref), but on HOPG this fluorescence is not observed, either due to quenching on the highly conjugated HOPG surface or due to polymerization in the non-fluorescent blue form (FIG. 2b, inset).

Comparisons of Molecular Film Structure after Transfer to PDMS.

Figure 3A:
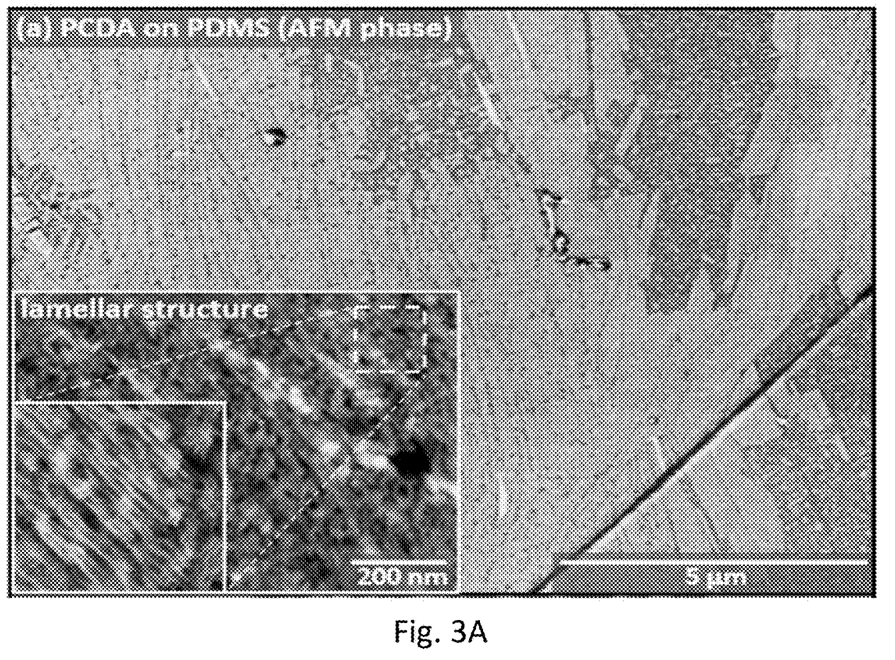
FIG. 3A shows AFM phase images showing domain structure and lamellar structure (inset) for PCDA after transfer to PDMS.
Figure 3B:
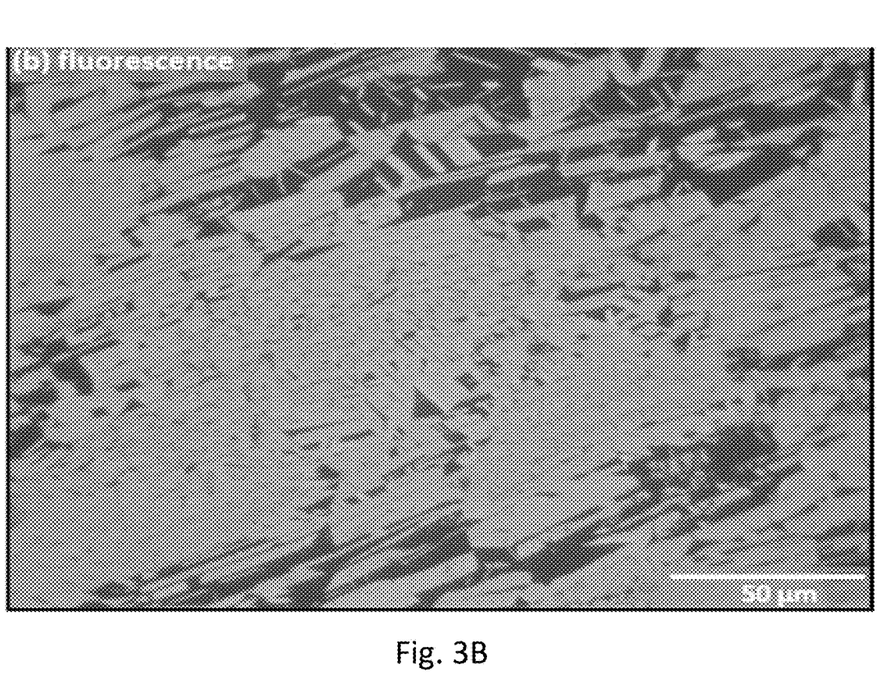
FIG. 3B shows Fluorescence image showing domain structure of PCDA on PDMS.

After transfer to PDMS, microscopic monolayer structure is visible in both AFM images (FIG. 3a) and fluorescence micrographs (FIG. 3b). AFM images are surface-sensitive; thus, post-transfer surface features with morphologies observed in molecular films on HOPG indicate that the molecular layer remains accessible on the surface, an important criterion for further use. Higher-resolution AFM images (FIG. 3a, inset) reveal nanoscopic vacancies and lamellar orientation. Although the surface appears roughened in comparison with the molecular layer on HOPG, stripe patterns remain visible on the surface, at sub-10-nm periodicities commensurate with PCDA molecular rows.

Optical properties of the ene-yne backbone provide a useful means of characterizing film structure on PDMS. Visible absorption and emission of the conjugated ene-yne have been extensively studied in standing-phase Langmuir films and bulk crystals of PCDA and similar molecules. Quenching of ene-yne fluorescence on HOPG has conventionally precluded optical characterization of such monolayer structures. Here, fluorescence micrographs of PCDA striped phases prior to transfer exhibit minimal emission (FIG. 2B, inset). However, when the film is separated from the HOPG substrate, fluorescence emission from the polymer backbone is observed (FIG. 3B). This capability enables the locations of transferred molecules to be characterized without contacting the surface.

Wetting of Molecular Film Before and after Transfer.

The ability of a molecular film to control wetting is crucial to its function as an interlayer. Previously, we have found that stripes of functional groups in monolayers on HOPG create substantial changes in wettability, which can depend on relatively small changes in molecular structure.

Functional groups at interfaces often undergo significant changes in their chemical behavior, including their ability to ionize. To assess the chemical behavior of functional groups in the films, we perform contact angle titrations, in which droplets of buffers with pH values ranging from 2-14 are exposed to the films. Ionization of functional groups in the monolayer alters surface hydrophilicity; for instance, ionization of carboxylic acids to carboxylates increases hydrophilicity, resulting in lower contact angles. The midpoint of the sigmoidal decrease in contact angle vs pH is typically taken to be the $pK_{1/2}$, the halfway point in ionization.

Here, we compare wettability of molecular films before and after transfer to PDMS, using droplets of buffers with pH values ranging from 3 to 13. Monolayers of 10,12-PCDA assembled on HOPG (FIG. 4, blue symbols) exhibit advancing contact angles (blue squares) decreasing from 80° to 70° at increasing pH values; receding contact angles decrease from 70° to 45°; these ranges are consistent with our previous observations of similar molecules.[15] After transfer (filled gold symbols), advancing contact angles are higher (97-107°), while receding angles remain similar to those on HOPG (60-70°). Advancing angles for PCDA on PDMS are lower than for PDMS cast and cured on bare HOPG (empty gold symbols, 110-115°), consistent with a surface exhibiting more polar functionality than pure PDMS.

Transfer of Multicomponent Films.

Figure 5A:
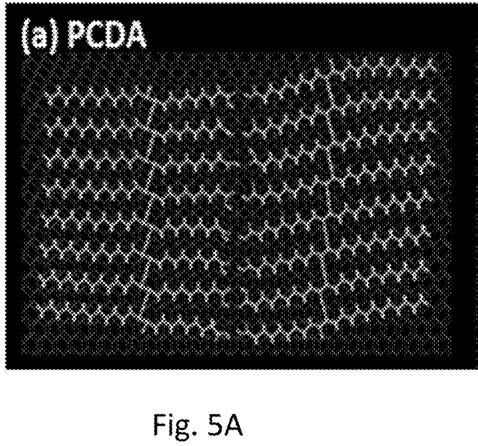
FIG. 5A shows a computer model structure of PCDA.
Figure 5B:
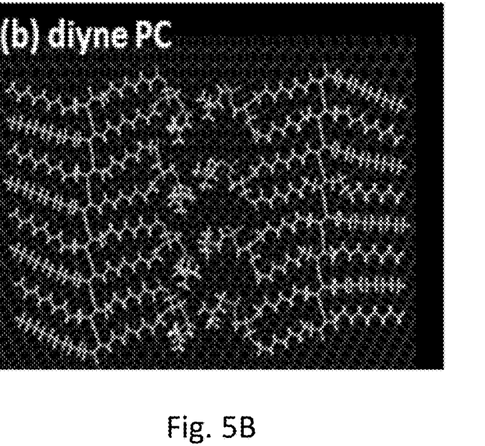
FIG. 5B shows a computer model structure of diyne PC.
Figure 5C:
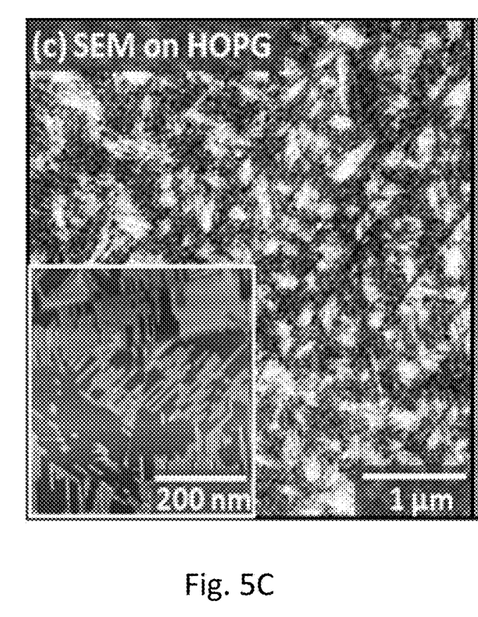
FIG. 5C shows SEM image of mixed monolayer of PCDA and diyne PC on HOPG.

To maximize functional density in the molecular film, it is important to be able to incorporate different molecular film constituents and distinguish their locations before and after transfer. Molecular models in FIGS. 5a and b illustrate monolayers of 10,12-PCDA and diyne phosphocholine (diyne PC), which can both form striped phases on HOPG. High-resolution AFM images (FIG. 5c, inset) show clear differences between rows of diyne PC (brigh stripes) and PCDA (dark background). SEM images exhibit contrast between the two molecules at larger microscopic scales more similar to those observed by fluorescence. Bright domains in the SEM micrograph correspond to diyne PC.

Figure 5D:
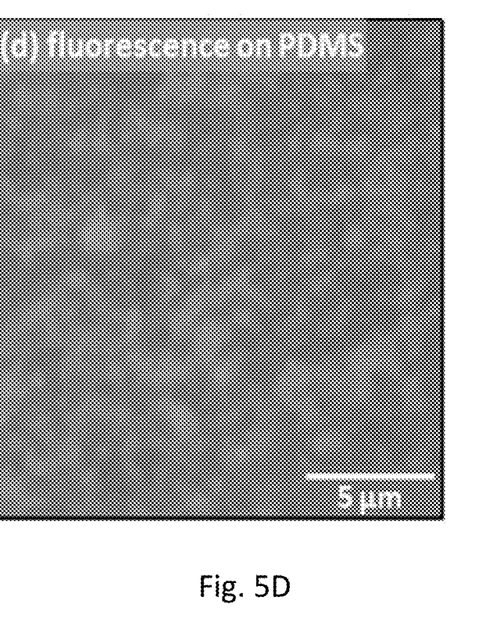
FIG. 5D shows Fluorescence image of PCDA/diyne PC monolayer transferred to PDMS.

After transfer, regions with differing color spectra and intensities are visible in fluorescence emission images (FIG. 5D), enabling regions of the two molecules to be distinguished. It is known that differences in ene-yne polymer backbone conformation (e.g. twisting) can produce spectral differences. In striped monolayers, phospholipids and fatty acids exhibit distinct chain ordering patterns, visible in FIGS. 5a and 5b. Because pairs of phospholipid chains are constrained by their connection through the glycerol backbone in the headgroup, molecular models suggest that zig-zag alkyl backbones alternate orientations parallel and perpendicular to the substrate. In contrast, for single-chain functional alkanes such as PCDA, chain backbones zig-zag parallel to the surface.

This finding points to the capability to identify nanoscopic regions of different headgroup chemistry both before and after transfer, important in using this procedure to functionalize surface so soft, non-epitaxial materials, as well as in aligning multiple transferred layers.

Identifying Molecular Orientation in Transferred Molecular Films.

Figure 6A:
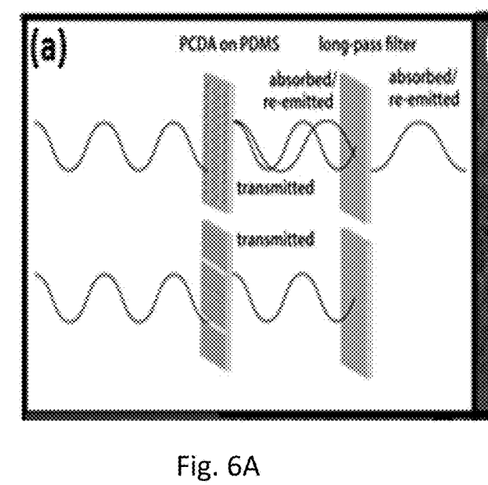
FIG. 6A shows a schematic of polarized emission of ene-yne polymer backbone in molecular film.
Figure 6B:
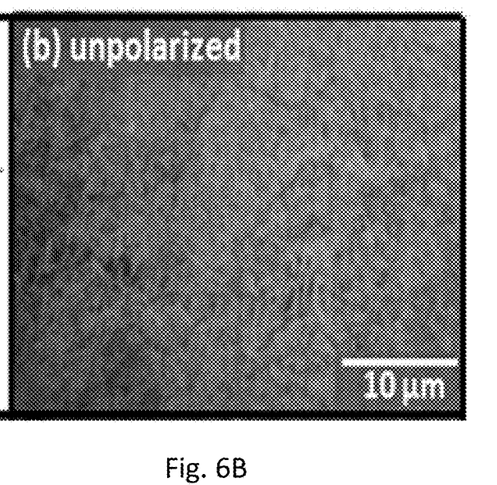
FIG. 6B shows unpolarized fluorescence image of diyne PC on PDMS.
Figure 6C:
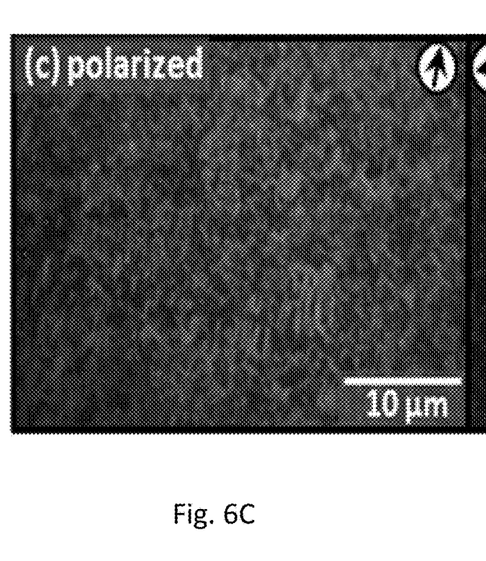
FIGS. 6C-6D show polarized fluorescence of same film area with polarizer orientations shown in arrows in upper corner of each panel.
Figure 6D:
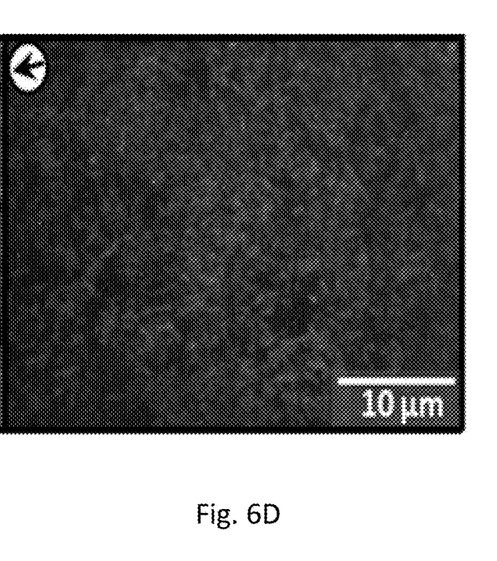

Identifying the orientation of molecular patterns in the sub-nm-thick films is also possible using polarized fluorescence imaging. The ene-yne polymer backbone is typically tens to hundreds of nm in length; this anisotropy translates to anisotropic absorption and emission profiles (FIG. 6a). Here, we illustrate that this property can be utilized to identify the orientation of stripes of polymerized molecules transferred to PDMS. FIG. 6b shows an unpolarized fluorescence image of a molecular film of diyne PC. When a polarizer is inserted in the emission path in the orientation shown in FIG. 6c (arrow in upper right corner of image), emission becomes localized to a series of striped patterns oriented along the polarization axis. When the polarizer is rotated to the orientation shown in FIG. 6d, emission is instead localized primary to striped patterns oriente along the new orientation axis.

Chemical Manipulation of Polymerized Molecular Films.

Figure 4:
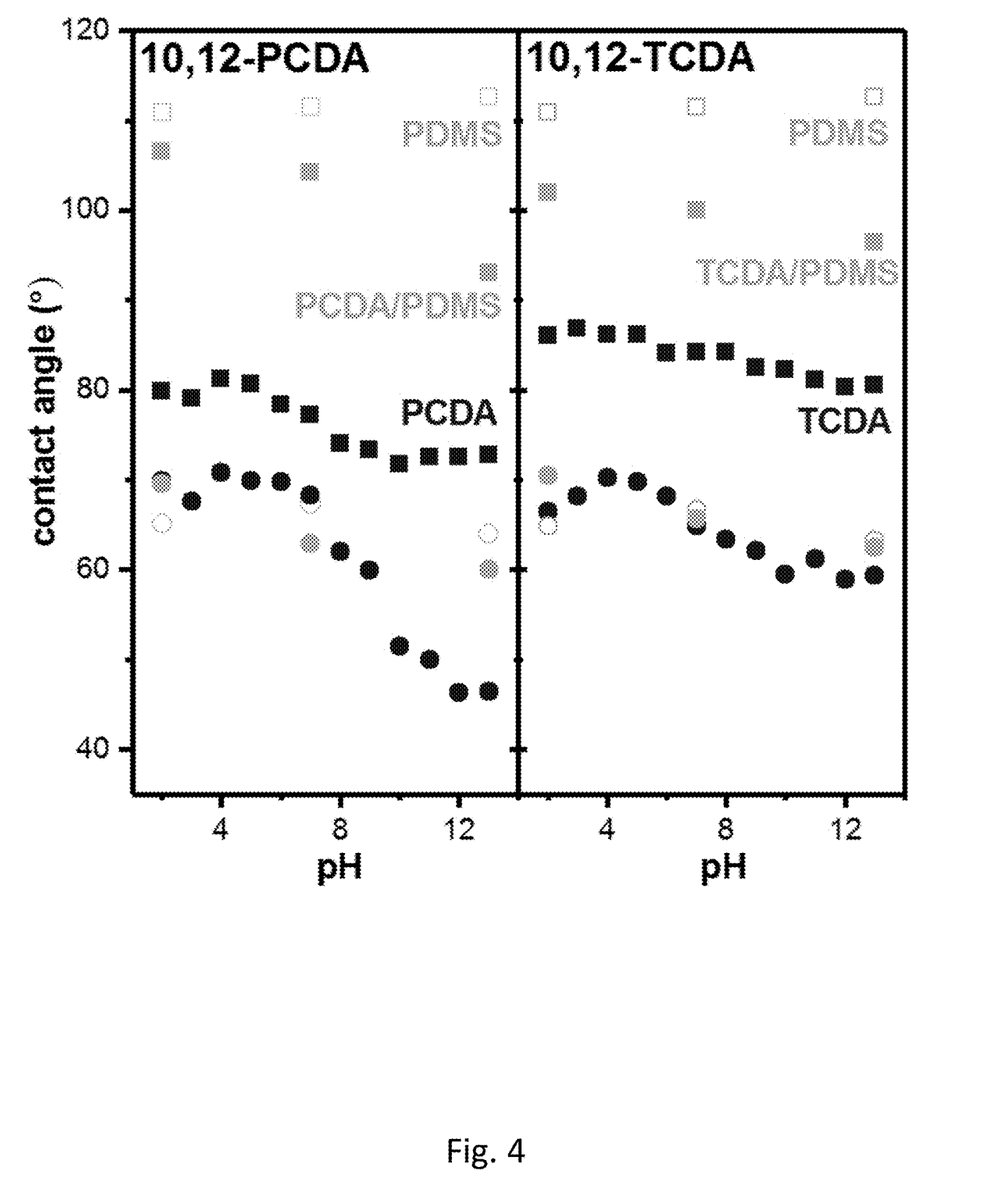
FIG. 4 shows contact angle titrations for (a) 10,12-PCDA and (b) 10,12-TCDA before and after transfer from HOPG (blue) to PDMS (gold).

Previously, it has been demonstrated that iodine doping can be used to increase conductivity of ene-yne molecular wires, by creating positive charge carriers. Here, we found that exposure to a solution of iodine prior to transfer (FIG. 4a) creates a new class of spectrally distinct monolayer region (FIG. 4b), visible in fluorescence following transfer to PDMS. Ultimately, this finding suggests the ability to selectively manipulate regions of the surface, either to create differences in electrical properties, or to change surface wetting by altering the availability of the functional headgroups at the interface.

The ability to create anisotropic nanocrystal lattices with a high degree of orientational order and spacings different than those dictated by the ligand shell has potential utility in controlling plasmon coupling and other physical properties in nanocrystal materials. More broadly, the findings presented here suggest design principles for creating surface templates in which ligands utilize structural flexibility to operate collectively in response to their environment. In biology, phospholipids operate in the relatively polar environment at the membrane periphery. Here, they confer similar utility in nonpolar environments common in inorganic nanocrystal synthesis. The capability to achieve the observed functions depends both on the presence of small numbers of water molecules on the surface and the availability of excess simple amphiphiles in solution. This suggests a minimal environment that may be necessary to recreate collective functions of the polar membrane periphery in a nonpolar solvent environment near a 2D material.

Experimental Methods

Materials.

4-Pentyn-1-amine, silver nitrate, N-bromosuccinimide, copper chloride dihydrate, potassium hydroxide, hydroxylamine hydrochloride, ethylamine, sulfuric acid, sodium thiosulfate, 10,12-pentacosadiynoic acid (10,12-PCD-COOH), oxalyl chloride, tetrahydrofuran (THF), lithium aluminum hydride, ammonium hydroxide, oleylamine (technical grade, 70%), triisopropylsilane (TIPS, 98%), and molecular sieves (4 Å) were purchased from Sigma Aldrich (Saint Louis, Mo.) and used as received. 1-Eicosyne was purchased from GFS Chemicals (Columbus, Ohio) and used as received. Methanol, diethyl ether, dichloromethane (DCM), acetone, dimethylformamide (DMF), ethyl acetate, ammonium chloride, sodium bicarbonate, sodium sulfate, magnesium sulfate, and sodium chloride were purchased from Fisher Scientific (Fair Lawn, N.J.) and used as received. Cyclohexane (HPLC grade), dry cyclohexane (99.5% extra dry, Acroseal), and gold tetrachloroauric acid trihydrate (ACS reagent grade) were purchased from Acros Organics (Fair Lawn, N.J.) and used as received. Silica gel was purchased from Machery Nagel (Bethlehem, Pa.) and used as received. 1,2-bis(10,12-tricosadiynoyl)-sn-glycero-3-phosphoethanolamine (diyne PE, >99% purity) was purchased from Avanti Polar Lipids (Alabaster, Ala.).

Procedure for Langmuir-Schaefer (LS) Transfer of Amphiphile Monolayers.

LS deposition was performed using a Kibron (Helsinki, Finland) MicroTrough XL. For transfer of single chain amphiphiles, 12 µL of a 0.75 mg/mL solution of the amphiphile in chloroform was deposited onto a subphase of deionized water at 30° C. The trough was equilibrated for 15 min, to allow the solvent from the spreading solution to evaporate; the trough barriers were then slowly swept inwards at a rate of 6 mm/min. A freshly cleaved HOPG substrate was heated to 45° C. using a custom-built thermally controlled dipping attachment reported previously.[17] When the desired packing density condition for transfer was achieved based on motion of the barriers (75 Å$^2$/chain for the 4,6-PCD-NH$_2$ and 10,12-PCD-NH$_2$ substrates used for wire growth), the HOPG substrate was lowered horizontally into contact with the subphase at a speed of 2 mm/min. Substrates utilized for direct imaging of lamellae were prepared at 3 mN/m (4,6-PCD-NH$_2$) and 50 Å$^2$/chain (10, 12-PCD-NH$_2$) to maximize visibility of lamellar boundaries. After 4 min in contact with the liquid interface, the HOPG was slowly lifted out of contact with the subphase at 2 mm/min.

For phospholipid monolayers, deposition was performed by spreading 30 µL of 0.50 mg/mL solution of diyne PE in chloroform on a subphase of 5 mM MnCl$_2$ at 30° C. For large ordered domains of diyne PE, 30 µL of 1.0 mg/mL solution in dichloromethane was utilized. After deposition, the trough was allowed to equilibrate for 30 min, in order to allow the solvent from the spreading solution to evaporate. Transfer was carried out at a surface pressure of 30 mN/m. Freshly cleaved HOPG was heated to 70° C. using the dipping attachment, then lowered into contact with the subphase at 2 mm/min. The HOPG was left in contact with the interface for 2 min and then withdrawn from the interface using the automated dipper.

All samples were dried with N$_2$ prior to further processing. Diacetylene-functionalized amphiphilic monolayers prepared as described above were then photopolymerized for 1 h via irradiation under a 254-nm 8-W UW lamp with approximately 4 cm between sample and lamp.

PDMS Transfer.

Substrates prepared as indicated above were taped to the bottom of a flat-bottom petri dish using double sided tape, with the face of the substrate containing the lipid template layer facing up. Polydimethyl siloxane (PDMS) was prepared using Sylgard 184 base and curing agent mixed in a 10:1 ratio of 10:1 (typical mixing time 5 min), then poured onto the substrate until it was immersed. The PDMS was then degassed in a vacuum dessicator by placing the system under vaccum and then releasing the vacuum to release bubbles. The process was repeated until bubbling of the PDMS slowed; the system was then left under vaccum for ~15 min or until no bubbles were visible. The petri dish was then placed in an oven to cure for 24 h at 60° C. Following curing, the substrate was removed from the oven, and PDMS surrounding the substrate was removed by with a razor. The remaining PDMS film was then gently peele away from the substrate.

Fluorescence Microscopy.

All fluorescence micrographs were obtained using a Olympus BX-51 Optical Microscope with an Olympus DP71 color camera. Images were obtained using a 40× (Metallographic, Plan fluorite aberration correction, NA=0.75, infinity corrected optics), 100× (Metallographic, Apochromatic and Flat Field correction, NA=0.95) bright-field objective, or a 100× (Metallographic, Plan-fluorite aberration correction, Normal field of view plan, NA=0.90, Bright or Dark Field (Hell, Dunkel)) and a UMWB2 filter cube with an exitation filter range of 460-490 nm, a dichroic filter with a wavelength cutoff of 500 nm, and an emission filter with a wavelength cutoff of 520 nm.

Fluorescence Polarization.

Fluorescence polarization imaging was performed using the Olympus U-AN360P 360 degree rotatable analyzer with a minimum angle of 0.1 degree. 30 µL of 0.5 mg/ml Diyne PE was placed at the interface. Compressed to 10 mN/m at 3 mm/min and dipped $MoS_2$ at 50° C. for 4 min. Dipping rate was 4 mm/min.

Iodine ($I^2$) Experiments.

Samples were dipped and polymerized as normal. 100 µL of either 1 mM or 0.001 mM solution of $I^2$ in water was pleased on top of the substrate for 1 hour and then wicked and dried with nitrogen. The substrate was then treated with PDMS as normal.

Surface templated wire growth. In a typical reaction, 1.25 mg of $HAuCl_4 \cdot 3H_2O$ was added to 6 mL of dry cyclohexane, followed by 42 uL of oleylamine. Molecular sieves were added to the reaction mixture to remove water. The solution was mixed briefly at room temperature using a vortexer. Triisopropylsilane (59 uL) was added and the solution was mixed again. The reaction mixture was immediately transferred to a beaker, and monolayer-templated substrates were lowered into contact with the liquid interface using a manual translation stage. A rubber stopper was then placed over the top of the beaker to limit evaporation. The solution was incubated at ambient temperature for 12 h, or the period of time indicated in the manuscript text. HOPG substrates were lifted out of contact with the solution, washed with 12 mL cyclohexane each, and dried with $N_2$. Dilution experiments followed the same procedure, varying the volume of solvent utilized in the initial reaction mixture (4 mL, 6 mL, 8 mL, or 12 mL). All substrates were stored at 4° C. following wire growth.

AFM Imaging.

All AFM imaging was performed under ambient conditions in air using either a Veeco (Bruker Instruments, Billerica, Mass.) MultiMode AFM or Agilent (Agilent, Palo Alto, Calif.) 5500 AFM. Imaging was performed in tapping mode with Bruker RFESP-75 tips (nominal force constant 3 N/m and radius of curvature <10 nm). Tip broadening was corrected using the equation $$w_0 = w_{exp} - 2(h^*[2r_0-h])^{1/2}$$

wherein $w_0$ is the corrected width, $w_{exp}$ is the experimentally measured width, and $r_o$ is the AFM tip radius of curvature.

TEM Imaging.

All TEM imaging was performed on a Tecnai G2 20 (Thermo Fisher Scientific, Hillsboro, Oreg.) with an accelerating voltage of 200 kV and a lanthanum hexaboride (LaB6) filament. TEM samples were prepared by depositing 6 µL of re-dispersed gold nanowire solution on a 200 mesh C/Cu grid (Ted Pella, Redding, Calif.). The solution was wicked from the grid after 10 s.

SEM Imaging.

SEM imaging of lipid monolayers was performed using a FEI NOVA NanoSEM field emission SEM (FEI Company, Hillsboro Oreg.). High resolution imaging was conducted at a working distance of ~4 mm using the through-the lens detector (TLD) with a 5 kV accelerating voltage, 30 µm diameter aperature and a beam current of 56 pA (spot size 3). SEM imaging of surface-templated AuNW arrays under high magnification was performed using a Teneo VS SEM (FEI Company, Hillsboro Oreg.) at a working distance of ~2 mm using the segmented in-lens T1 backscattered electron (BSE) detector. Beam currents of 0.10 nA or 25 pA were selected for best resolution image acquisition through a 32 µm diameter aperature with an accelerating voltage of 5 kV. All substrates were affixed to standard SEM pin stub specimen mounts with conductive carbon tape. To further enhance substrate-mount conductivity, a small amount of colloidal silver paint (PELCO®, Ted Pella, Inc.) was applied along the perimeter of the HOPG from the face down to the pin stub.

Energy Minimization.

Figure 7A:
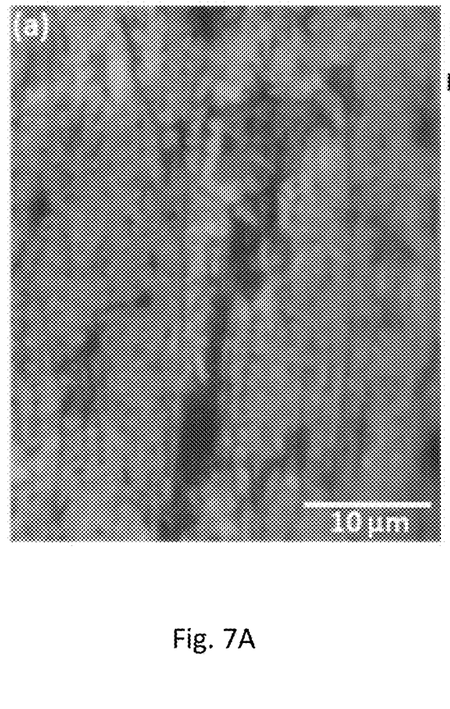
FIG. 7A shows a Fluorescence image of PCDA monolayer doped with iodine from aqueous solution, and subsequently transferred to PCDA.
Figure 7B:
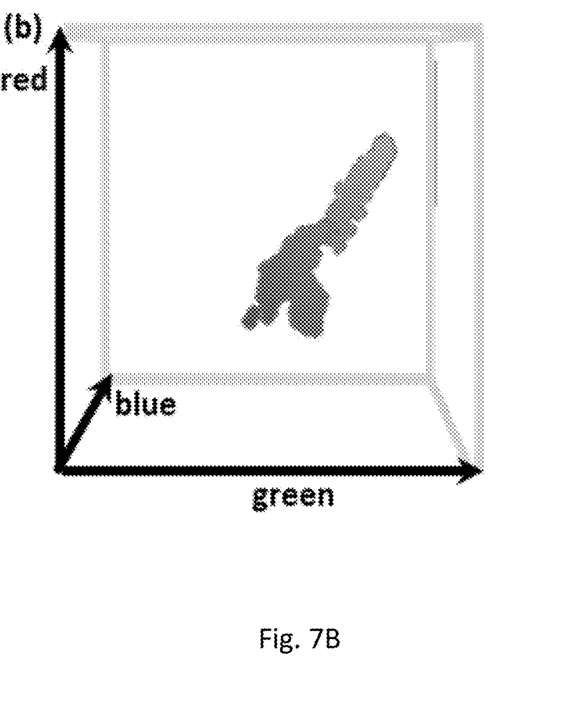
FIG. 7B shows a RGB spectral composition of three visibly distinct regions of the monolayer shown in (FIG. 7A).

Software packages Maestro and Macromodel (Schrödinger, Cambridge Mass.) were used, respectively, to visualize molecular structures and to perform force field minimizations. Models of lamellar structures were minimized using the OPLS_2005 force field, with normal cutoffs for Van der Waals, electrostatic and hydrogen bonding interactions. Minimizations were performed using the Polak-Ribiere conjugate gradient (PRCG) algorithm and gradient method with 50000 runs and a convergence threshold of 0.05. Ligand shells for models including AuNWs in FIG. 7 are to illustrate scale, and were not minimized.

Those skilled in the art will recognize that numerous modifications can be made to the specific implementations described above. The implementations should not be limited to the particular limitations described. Other implementations may be possible.

It is intended that the scope of the present methods and apparatuses be defined by the following claims. However, it must be understood that this disclosure may be practiced otherwise than is specifically explained and illustrated without departing from its spirit or scope. It should be understood by those skilled in the art that various alternatives to the embodiments described herein may be employed in practicing the claims without departing from the spirit and scope as defined in the following claims.

What is claimed is:

1. A process for manufacturing a coating or functional surface comprising the steps of
   a. preparing a polymerizable amphiphile comprising both hydrophobic and hydrophilic constituents with chemical functional groups;
   b. preparing a supporting 2D material substrate;
   c. preparing a monolayer or thin film of said polymerizable amphiphile on said supporting 2D material substrate, wherein said hydrophobic and hydrophilic constitutes of the polymerizable amphiphile are positioned to form a chemical functional pattern of parallel lines of about 1-nm-wide with said chemical functional groups arranged with a controlled periodicity in the range of about 5-10 nm;
   d. polymerizing said amphiphiles to afford a polymerized monolayer or thin film on said supporting 2D material substrate;
   e. applying a transferring material over the polymerized monolayer or thin film on said supporting 2D material substrate; and f. curing or crosslinking said transferring material and transferring the polymerized monolayer or thin film from said supporting 2D material substrate to a product.

2. The process of claim 1 further comprising a step of chemical processing of said polymerized monolayer or thin film to create a multifunctional patterned surface.

3. The process of claim 2, wherein said processing further involves a step of adding an inorganic or organic structured template with a chemical functional pattern.

4. The process of claim 1 further comprising a step of chemical processing of said polymerized monolayer or thin film before applying said transferring material.

5. The process of claim 1, wherein multiple types of polymerized amphiphiles are utilized in preparing the monolayer or thin film, resulting in creation of a multifunctional patterned surface.

6. The process of claim 1, wherein said transferring material is a polymer.

7. The process of claim 1, wherein said transferring material is polydimethyl siloxane (PDMS).

8. The process of claim 1, wherein said supporting 2D material substrate is graphene, highly oriented pyrolytic graphite (HOPG), or a layered material comprising $MoS_2$ or $WS_2$.

9. The process of claim 1, wherein said polymerization of an amphiphile monolayer or thin film is performed by irradiating with an UV light.

10. The process of claim 1, wherein said polymerizable amphiphile is a polymerizable lipid.

11. The process of claim 10 wherein said polymerizable amphiphile is a single-chain or dual chain polymerizable lipid incorporating one or more functional groups.

12. The process of claim 10, wherein said polymerizable single-chain amphiphile is 4,6-pentacosadiyneamine or 10,12-pentacosa-diynamine.

13. The process of claim 10, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE).

14. A sub-nanometer-thick coating or functional surface prepared according to the process of claim 1.

15. A sub-nanometer-thick coating or functional surface manufactured according to the process of
   a. preparing a polymerizable amphiphile comprising both hydrophobic and hydrophilic constituents with chemical functional groups;
   b. preparing a supporting 2D material substrate;
   c. preparing a monolayer or thin film of said polymerizable amphiphile on said supporting 2D material substrate, wherein said hydrophobic and hydrophilic constitutes of the polymerizable amphiphile are positioned to form a chemical functional pattern of parallel lines of about 1-nm-wide with said chemical functional groups arranged with a controlled periodicity in the range of about 5-10 nm;
   d. polymerizing said amphiphiles to afford a polymerized monolayer or thin film on said supporting 2D material substrate;
   e. applying a transferring material over the polymerized monolayer or thin film on said supporting 2D material substrate; and
   f. curing or crosslinking said transferring material and transferring the polymerized monolayer or thin film from said supporting 2D material substrate to a product.

16. The sub-nanometer-thick coating or functional surface of claim 15, wherein said process further comprising a step of chemical processing/manipulation of said polymerized monolayer or thin film to create a multifunctional patterned surface.

17. The sub-nanometer-thick coating or functional surface of claim 15, wherein said process further comprising a step of chemical processing/manipulation of said polymerized monolayer or thin film before applying said transferring material.

18. The sub-nanometer-thick coating or functional surface of claim 15, wherein said transferring material is polydimethyl siloxane (PDMS).

19. The sub-nanometer-thick coating or functional surface of claim 15, wherein said supporting 2D material substrate is graphene, highly oriented pyrolytic graphite (HOPG), or a layered material comprising $MoS_2$ or $WS_2$.

20. The sub-nanometer-thick coating or functional surface of claim 15, wherein said polymerizable amphiphile is a single-chain fatty amine or dual-chain phospholipid with a terminal amine.

\* \* \* \* \*